US009443576B1

(12) United States Patent
Miller

(10) Patent No.: US 9,443,576 B1
(45) Date of Patent: Sep. 13, 2016

(54) JOSEPHSON MAGNETIC RANDOM ACCESS MEMORY WITH AN INDUCTIVE-SHUNT

(71) Applicant: Microsoft Technology Licensing, LLC, Redmond, WA (US)

(72) Inventor: Donald L. Miller, Export, PA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/935,862

(22) Filed: Nov. 9, 2015

(51) Int. Cl.
*G11C 11/44* (2006.01)
*G11C 11/16* (2006.01)

(52) U.S. Cl.
CPC .............. *G11C 11/44* (2013.01); *G11C 11/161* (2013.01); *G11C 11/1673* (2013.01)

(58) Field of Classification Search
CPC .. G11C 11/44; G11C 11/161; G11C 11/1673
USPC ............... 365/162, 157, 158, 160, 171, 173; 257/31
See application file for complete search history.

(56) References Cited

U.S. PATENT DOCUMENTS

| 4,151,605 A | 4/1979 | Faris | |
|---|---|---|---|
| 4,509,146 A * | 4/1985 | Wang ...................... | G11C 11/44 257/E39.014 |
| 5,260,264 A * | 11/1993 | Kurosawa ................ | G11C 11/44 257/31 |
| 5,610,857 A * | 3/1997 | Nandakumar .......... | G11C 11/44 257/31 |
| 5,872,731 A | 2/1999 | Chan et al. | |
| 6,154,044 A | 11/2000 | Herr | |
| 6,242,939 B1 | 6/2001 | Nagasawa et al. | |
| 6,960,929 B2 * | 11/2005 | Bedard ................... | H03K 17/92 326/1 |
| 8,208,288 B2 | 6/2012 | Bulzacchelli et al. | |
| 8,270,209 B2 | 9/2012 | Herr et al. | |
| 8,971,977 B2 | 3/2015 | Mukhanov et al. | |
| 2015/0043273 A1 | 2/2015 | Naaman et al. | |
| 2015/0094207 A1 | 4/2015 | Herr et al. | |

FOREIGN PATENT DOCUMENTS

| JP | 2000201067 A | 7/2000 |
|---|---|---|
| WO | 2014197095 A2 | 12/2014 |

OTHER PUBLICATIONS

Mukhanov, Oleg A., "Energy-Efficient Single Flux Quantum Technology", In Proceedings of IEEE Transactions on Applied Superconductivity, vol. 21, Issue 3, Jun. 2011, pp. 760-769.

(Continued)

*Primary Examiner* — Tan T Nguyen
(74) *Attorney, Agent, or Firm* — Steve Wight; Sandy Swain; Micky Minhas

(57) ABSTRACT

A memory system includes a word-line coupled to memory cells in a row, and a bit-line coupled to memory cells in a column. Each of the memory cells includes a memory storage element including a Josephson junction configured to be in either a first state or a second state in response to an application of a word-line current to the Josephson junction. A read operation is performed on the at least one memory storage element by an application of a bit-line current to the bit-line. At least one inductive-shunt, coupled in parallel to the at least one memory storage element, is configured to, after the read operation, remove at least a substantial portion of the bit-line current provided to the at least one memory storage element without requiring removal of an entirety of the bit-line current applied to the bit-line during the read operation.

20 Claims, 8 Drawing Sheets

(56) References Cited

OTHER PUBLICATIONS

Polonsky, et al., "Rapid Single Flux Quantum Random Access Memory", In Proceedings of IEEE Transactions on Applied Superconductivity, vol. 5, Issue 2, Jun. 1995, pp. 3000-3005.

Nagasawa, et al., "A 380 Ps, 9.5 Mw Josephson 4-Kbit RAM Operated at a High Bit Yield", In Proceedings of IEEE Transactions on Applied Superconductivity, vol. 5, Issue 2, Jun. 1995, pp. 2447-2452.

Vernik, et al., "Magnetic Josephson Junctions with Superconducting Interlayer for Cryogenic Memory", In Proceedings of IEEE Transactions on Applied Superconductivity, vol. 23, Issue 3, Jun. 2013, 8 pages.

Likharev, et al., "RSFQ Logic/Memory Family: A New Josephson-Junction Technology for Sub-Terahertz-Clock-Frequency Digital Systems", In Proceedings of IEEE Transactions on Applied Superconductivity, vol. 1, Issue 1, Mar. 1991, pp. 3-28.

Yoshikawa, et al., "Characterization of 4 K CMOS Devices and Circuits for Hybrid Josephson-CMOS Systems", In Proceedings of IEEE Transactions on Applied Superconductivity, vol. 15, Issue 2, Jun. 2005, pp. 267-271.

Patel, et al., "Self-Shunted Nb/AIO/sub x//Nb Josephson Junctions", In Proceedings of IEEE Transactions on Applied Superconductivity, vol. 9, Issue 2, Jun. 1999, pp. 3247-3250.

\* cited by examiner

JOSEPHSON MAGNETIC RANDOM ACCESS MEMORY WITH AN INDUCTIVE-SHUNT

BACKGROUND

Semiconductor based integrated circuits used in electronic devices, such as random access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random access memories, are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, certain amount of power is wasted not only as a result of the requirement to maintain the state of the CMOS transistors, but also as a result of the current leakage.

An alternative approach to CMOS technology based memory is a superconducting logic based memory.

SUMMARY

In one example, the present disclosure relates to a memory system including an array of memory cells arranged in rows and columns. The memory system may further include: (1) a first set of word-lines, where each of the first set of the word-lines is coupled to a first plurality of memory cells in at least one row, and (2) a first set of bit-lines, where each of the first set of the bit-lines is coupled to a second plurality of memory cells in at least one column. Each of the first plurality of the memory cells and each of the second plurality of the memory cells may further include at least one memory storage element including at least one Josephson junction configured to be in either a first state or a second state in response to an application of a word-line current, via at least one of the first set of the word-lines, to the at least one Josephson junction. A read operation may be performed on the at least one memory storage element by an application of a bit-line current to the at least one of the first set of the bit-lines. Each of the first plurality of the memory cells and each of the second plurality of the memory cells may further include at least one inductive-shunt coupled in parallel to the at least one memory storage element, where the inductive-shunt is configured to after the read operation, remove at least a substantial portion of the bit-line current provided to the at least one memory storage element without requiring removal of an entirety of the bit-line current applied to the at least one of the first set of the bit-lines during the read operation.

In another aspect, a method in a memory system including an array of memory cells arranged in rows and columns, a first set of word-lines, where each of the first set of the word-lines is coupled to a first plurality of memory cells in at least one row, a first set of bit-lines, where each of the first set of the bit-lines is coupled to a second plurality of memory cells in at least one column, where each of the first plurality of the memory cells and each of the second plurality of the memory cells may include at least one memory storage element including at least one Josephson junction comprising a magnetic barrier layer, is provided. The method may include performing a first read operation in response to a first bit-line current applied to the at least one of the first set of the bit-lines and a first word-line current applied to the at least one of the first set of word-lines. The method may further include using an inductive-shunt, coupled in parallel to the at least one memory storage element, removing at least a substantial portion of the first bit-line current provided to the at least one memory storage element during the first read operation, without requiring removal of an entirety of the first bit-line current applied to the at least one of the first set of the bit-lines during the read operation.

In yet another aspect, a memory system including an array of memory cells arranged in rows and columns is provided. The memory system may further include: (1) a first set of word-lines, where each of the first set of the word-lines is coupled to a first plurality of memory cells in at least one row, and (2) a first set of bit-lines, where each of the first set of the bit-lines is coupled to a second plurality of memory cells in at least one column. Each of the first plurality of the memory cells and each of the second plurality of the memory cells may further include at least one memory storage element including at least one Josephson junction comprising at least one magnetic barrier layer, where the at least one magnetic barrier layer may be configured to be in either a first magnetization state or a second magnetization state in response to an application of a word-line current, via at least one of the first set of the word-lines, to the at least one Josephson junction. A read operation may be performed on the at least one memory storage element by an application of a bit-line current to at least one of the first set of the bit-lines. The memory system may further include at least one inductive-shunt coupled in parallel to at least N memory storage elements, where N is a positive integer, and where the inductive-shunt is configured to after the read operation, remove at least a substantial portion of the bit-line current provided to the at least the N memory storage elements without requiring removal of an entirety of the bit-line current applied to the at least one of the first set of the bit-lines during the read operation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
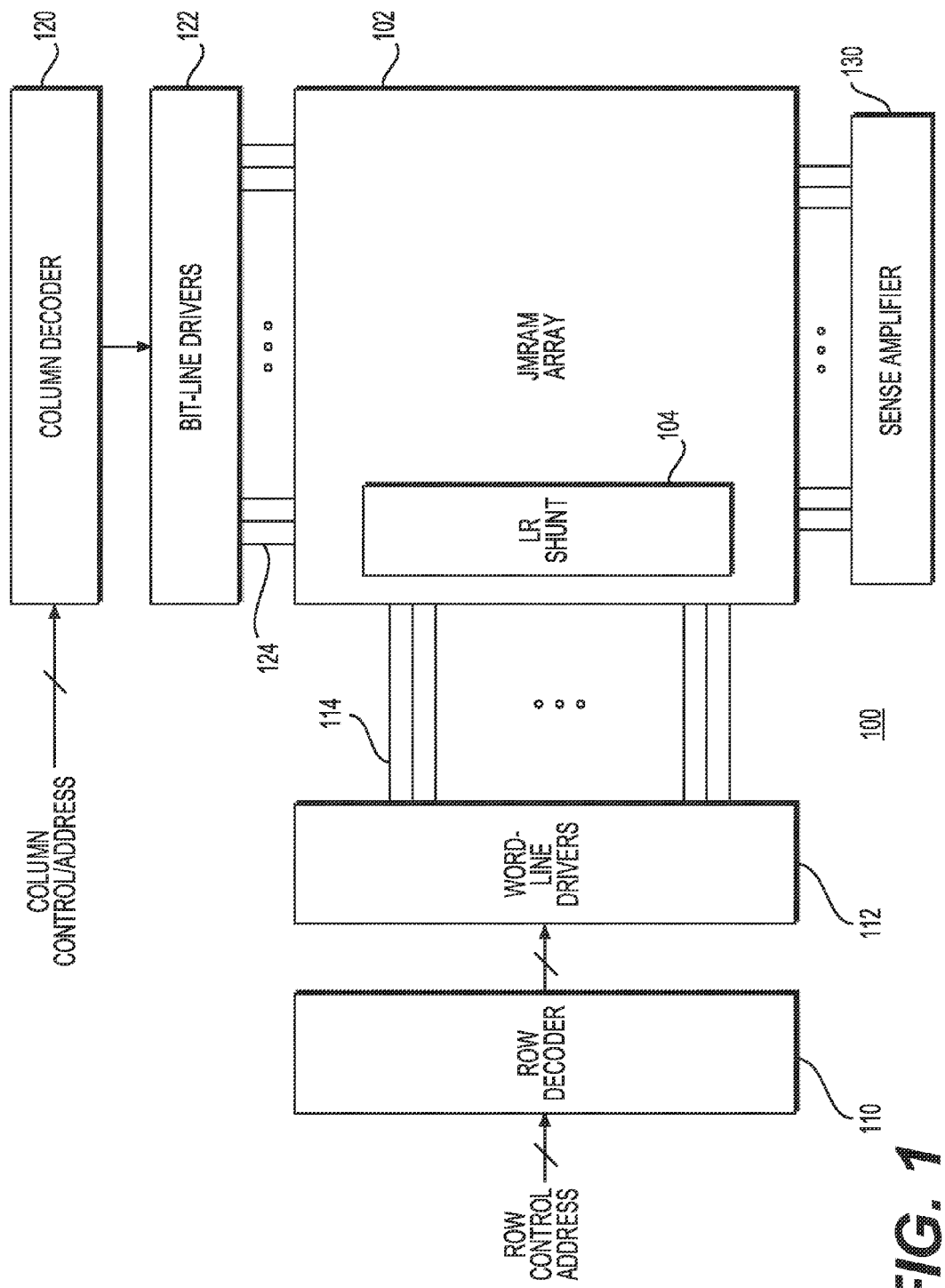
FIG. 1 shows a diagram of a memory system in accordance with one example.

Examples described in this disclosure relate to superconducting logic based memory devices, including Josephson Magnetic Random Access Memories (JMRAMs). Certain examples further relate to reciprocal quantum logic (RQL) compatible JMRAMs. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. Exemplary superconductors, such as Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates, include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

In general, microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. As an example, such a memory cell may be read out using a superconducting quantum interference device (SQUID). The memory cell may include a SQUID and a magnetic Josephson junction (MJJ) device, which may be configured such that under the application of appropriate amounts of current bias and magnetic flux, the memory cell may be in a logic '1' state or in a logic '0' state. In one example, if the memory cell is in the logic '1' state, under the application of a current via a word-line, the SQUID may transition into a "voltage state." A sense amplifier coupled to the memory cell may sense the voltage as being representative of the logic '1' state. The logic '0' state may correspond to a "substantially zero-voltage state," such that in the logic '0' state, despite the application of a current via a word-line, the SQUID may stay in the "substantially zero-voltage state." The sense amplifier may sense this as being representative of the logic '0' state.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source, for example, a flux pump. Two types of superconducting quantum interference devices (SQUIDs) may be used to generate the signals sensed by the sense amplifier. In one example, non-latching SQUIDs may be used. Such non-latching SQUIDs may, when in the logic '1' state, produce a voltage as long as the read word-line signal is applied. When the read word-line signal is removed, the non-latching SQUIDs may revert back to a zero voltage state. The use of non-latching SQUIDs may have some limitations, including, for example, the voltage produced by the SQUID may be affected by variations in: (1) the critical currents of the Josephson junctions used as part of the SQUID, (2) the inductance of the SQUID, (3) the flux bias applied to the memory cells, and (4) the bias current supplied to the column of the memory cells. The principles of physics may limit the voltage to approximately 200 micro-volts. That in turn, may drive the transmission line impedance to approximately 20 ohms to ensure sufficient current to the sense amplifiers. The lower impedance may require additional capacitance, which in turn, may increase the footprint of the memory system and thereby reduce the data storage capacity of the memory.

To obviate some of these limitations, a second type of SQUID may be used in such memory systems. Such SQUIDs may be latching SQUIDs and they may use un-shunted Josephson junctions. When activated, such a SQUID may produce a voltage of approximately 2.5 milli-volts.

FIG. 1 shows a diagram of a memory system 100 in accordance with one example. Memory system 100 may include an array 102 of memory cells arranged in rows and columns. In one example, array 102 may be an array of memory cells, e.g., Josephson Magnetic Random Access (JMRAM) memory cells. Each of the memory cells may further be coupled to an inductive-shunt (e.g., LR-SHUNT 104). Memory system 100 may further include a row decoder 110 that may be configured to decode row control/address signals. Row decoder 110 may further be coupled to word-line drivers 112. Word-line drivers 112 may include circuitry to provide word-line read/write current to a subset or all of the memory cells associated with a selected word-line for any read or write operations. Word-line drivers 112 may provide such current via word-lines 114. Word-lines 114 may include both read word-lines and write word-lines. In other words, different word-lines may be used to provide current to the selected memory cells for read or write operations. Memory system 100 may further include column decoder 120 that may be configured to decode column control/address signals. Column decoder 120 may further be coupled to bit-line drivers 122. Bit-line drivers 122 may include circuitry to provide bit-line read current to a subset or all of the memory cells associated with a selected bit-line for any read or write operations. Bit-line drivers 122 may provide such current via bit-lines 124. Bit-lines 124 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 124) may further be coupled to sense amplifier 130 for sensing bit-lines to determine the logical state of each of the array 102 of memory cells. The coupling between the array 102 of memory cells and sense amplifier 130 may include radio frequency (RF) transmission lines. The memory cells in each column may be serially current-biased by a common current source (e.g., a flux pump). As described earlier, bit-lines 124 may be used to couple this current to each of the memory cells in a column. As described more, with respect to FIG. 2, sense amplifier 130 may measure the bit-line current or the bit-line voltage to determine a state of a memory cell. Although FIG. 1 shows a certain number of components of memory system 100 arranged in a certain manner, there could be more or fewer number of components arranged differently.

Figure 2:
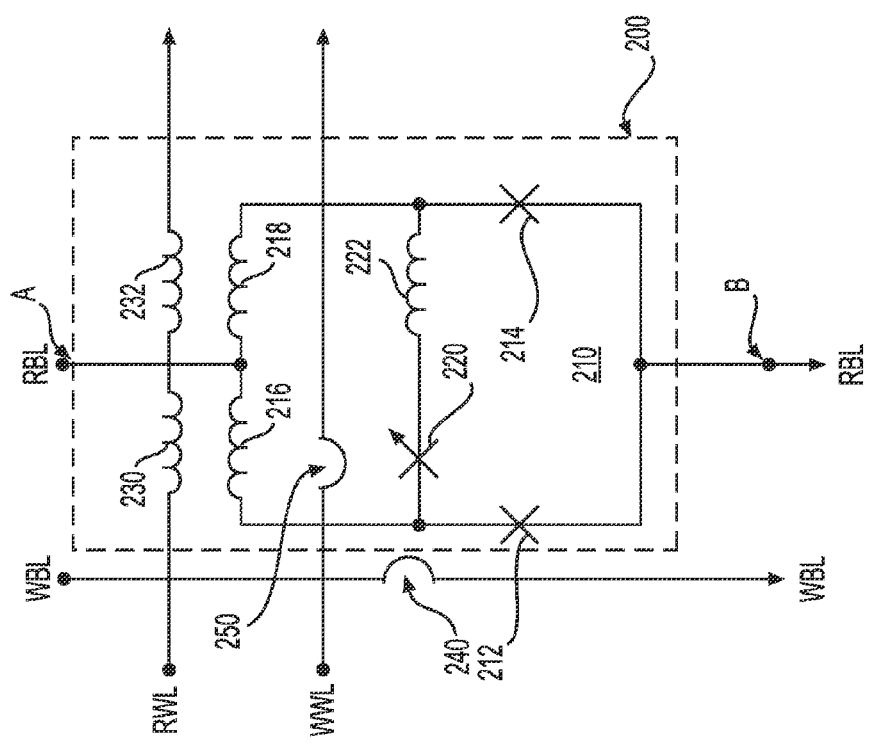
FIG. 2 shows a diagram of a memory cell in accordance with one example.

FIG. 2 shows a diagram of a memory cell 200 in accordance with one example. In one example, memory cell 200 may include a memory storage element 210 including at least one magnetic Josephson junction (MJJ) device 220 and at least two Josephson junctions 212 and 214 and an inductor 222. In one example, each of Josephson junctions 212 and 214 may be a superconductor-insulator-superconductor (SIS) type of Josephson junction. Memory cell 200 may further include two inductors 216 and 218. In one example, Josephson junctions 212 and 214 may form a readout superconducting quantum interference device (SQUID). In one example, MJJ device 220 may be a superconductor with at least two magnetic barrier layers (e.g., ferromagnetic barriers) that are compatible with single flux quantum (SFQ) pulse-based circuits. In another example, there could be two magnetic barrier layers, with one of them having a fixed magnetic field and the other one of them having a varying magnetic field. A superconductor-insulator-superconductor (SIS) type device discussed earlier may be modified to be a SIS/ferromagnetic-superconductor (SIS/FS) type of device. In addition, in such MJJ devices, in the SIS part of the device, the superconductors may be niobium (Nb) super-conductors and the insulators may be metal-oxide barriers (e.g., $Al_2O_3$). In the FS part of the device, the superconductors may be niobium superconductors and the ferromagnetic barriers may be palladium/iron (Pd/Fe) type of barriers. Other types of materials, such as aluminum may be used with Niobium for the superconductors. In one example, the SIS/FS type of devices may be compatible with the SIS type of devices, such as the two could be combined to create more complex systems, such as memory system 100 of FIG. 1.

With continued reference to FIG. 2, memory cell 200 may be coupled to word-lines and bit-lines for performing various memory operations, including, for example read and write operations. As an example, a read word-line (RWL) for performing a read operation may be coupled to memory cell 200. A write word-line (WWL) for performing a write operation may be coupled to memory cell 200. In addition, a read bit-line (RBL) for performing a read operation may be coupled to memory cell 200. A write bit-line (WBL) for performing a write operation may also be coupled to memory cell 200. Each of the word-lines may be one of the word-lines 114 of FIG. 1. Similarly, each of the bit-lines may be one of the bit-lines 124 of FIG. 1. The write bit-line may be magnetically coupled (via coupling 240) to MJJ 220. In one example, coupling 240 with MJJ 220 may be such that a magnetic field generated by at least one of the magnetic barrier layers of MJJ 220 can be changed by the application of a local read word-line current and/or by the application of a local bit-line current. The write word-line may be magnetically coupled (via coupling 250) to MJJ 220. In one example, coupling 250 with MJJ 220 may be such that a magnetic field generated by at least one of the magnetic barrier layers of the MJJ can be changed by the application of a local write word-line current and/or by the application of a write bit-line current. In one example, MJJ 220 may be in a first state (e.g., corresponding to a first configuration of magnetization of the at least one magnetic barrier layer) and a second state (e.g., corresponding to a second configuration of magnetization of the at least one magnetic barrier layer), where the first configuration of the magnetization may be substantially different from the second configuration of the magnetization. In one example, MJJ 220 may be in one state when the magnetic fields generated by each of the at least two magnetic barrier layers oppose each other. In one example, this state may be the "zero state" of MJJ 220. MJJ 220 may be in a different state when the magnetic fields generated by each of the at least two magnetic barrier layers support each other. In one example, this state may be the "π state." In the "π state," MJJ 220 may apply flux to JJs 212 and 214 such that under the application of a word read current via inductors 230 and 232 the induced currents, in memory storage element 210, due to the flux generated by MJJ 220 and by the coupling of the word-read current to inductors 216 and 218, may combine with a bit-read current applied at node A to trigger the Josephson junctions 212 and 214 into a 2.5 millivolts state. This voltage may generate a current along the read bit-line, which may act as a transmission line with a certain impedance. This current may be sensed using a sense amplifier. In one example, during a write operation, the write word-line (WWL) and the write bit-line (WBL) may receive current from the respective drivers (e.g., word-line drivers 112 and bit-line drivers 122 of FIG. 1). The local write word-line current and the local write bit-line current may change a magnetic field associated with at least one of the magnetic barrier layers of MJJ 220. When this magnetic field (e.g., created by the local word-line current and the local bit-line current) causes the respective magnetic field of the magnetic barrier layers to support each other, then MJJ 220 may be in the "π state." Conversely, when this magnetic field (e.g., created by the local word-line and the local bit-line currents) causes the respective magnetic field of the at least one of the magnetic field barriers to oppose each other, then MJJ 220 may be in a "zero state." In one example, the "π state" may correspond a logic '1' state and the "zero state" may correspond to a logic '0' state of memory cell 200.

With continued reference to FIG. 2, during a read operation, the read word-line (RWL) and the read bit-line (RBL) may receive current from the respective drivers (e.g., word-line drivers 112 and bit-line drivers 122 of FIG. 1). In one example, read word-line (RWL) may be coupled to inductor 230 and inductor 232. Although FIG. 2, shows inductors 230 and 232 as discrete components, they may not be, as the inductance may be derived from an arrangement of the layers of materials used to manufacture memory storage element 210. In one example, read bit-line (RBL) may be coupled directly to memory storage element 210 and provide a local bit-line current. A substantially equal amount of the local bit-line current may flow to each of the Josephson junctions (e.g., Josephson junction 212 and Josephson junction 214). In one state (e.g., the π state), MJJ 220 may provide a flux bias to the readout SQUID formed by Josephson junctions 212 and 214. During a read operation, this flux bias from MJJ 220 may add to the flux generated by the current flowing through the local read word-line causing the readout SQUID to transition to a voltage state. In a second state (e.g., the zero state), MJJ 220 may not provide any flux bias to the readout SQUID formed by Josephson junctions 212 and 214. The flux generated as a result of the current flowing through the local read word-line may not be enough to drive the readout SQUID into a voltage state. The change in an output voltage, current, or any other parameter of memory storage element 210 may be sensed using a sense amplifier (e.g., sense amplifier 130 of FIG. 1). In one example, the presence or absence of a current pulse, once amplified by the sense amplifier, may determine the state of memory cell 200 as logic '0' or logic '1'. As an example, the logic '1' state may correspond to a "voltage state," in which a sense amplifier coupled to the memory cell may sense the voltage as being representative of the logic '1' state. The logic '0' state may correspond to a "substantially zero-voltage state," such that the sense amplifier may sense this as being representative of the logic '0' state. In this example, the voltage of memory cell 200 depends upon the application of the current via the read word-line (RWL). Nodes A and B, shown in FIG. 2, may be viewed as terminals of a radio frequency transmission line. The impedance of memory cell 200 may be determined based on the inductance (L), from node A to node B, and by the capacitance (C) of memory cell 200 with respect to a ground using the equation:

$$Z = \sqrt{\frac{L}{C}}.$$

Although FIG. 2 shows a certain number of components of a memory cell 200 arranged in a certain manner, there could be more or fewer number of components arranged differently.

Figure 3:
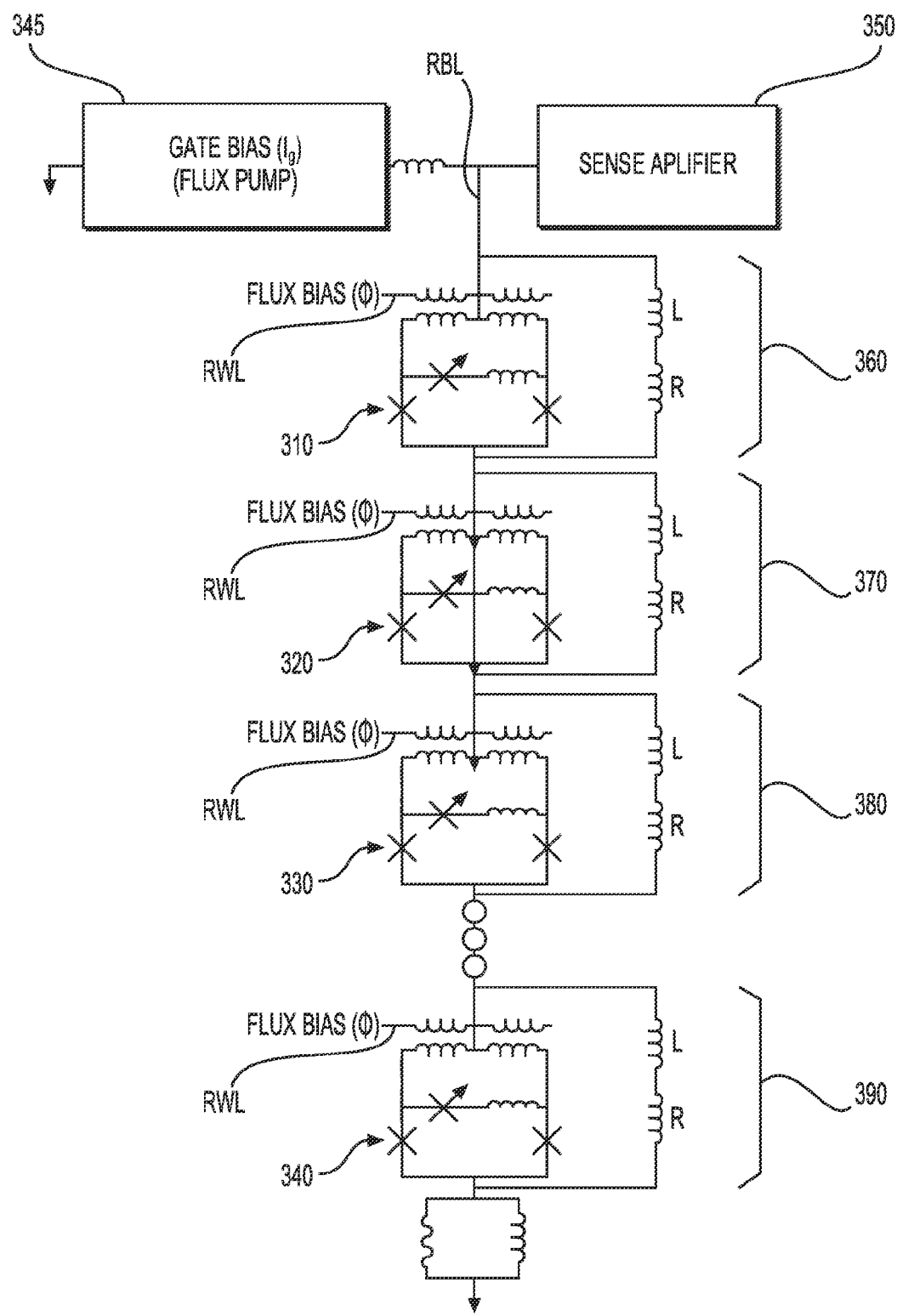
FIG. 3 shows a portion of a memory system in accordance with one example.

FIG. 3 shows a portion 300 of a memory system in accordance with one example. Portion 300 shows a column of memory system 100. The column corresponds to a bit-line (e.g., RBL). The column may include memory cells 310, 320, 330, and 340. Each of these memory cells may be like memory cell 200 of FIG. 2. They may include the same components as discussed with respect to FIG. 2. A flux pump 345 may be used to supply gate bias to memory cells 310, 320, 330, and 340. A sense amplifier 350 may be used to sense the current on read bit-line to determine a state of a memory cell. In this example of the column of a memory system 100, a LR shunt 360 may be coupled in parallel to memory cell 310. Another LR shunt 370 may be coupled in parallel to memory cell 320. Yet another, LR shunt 380 may be coupled in parallel to memory cell 330. In addition, a LR shunt 390 may be coupled in parallel to memory cell 340. Thus, in this example, each memory cell may have an LR shunt coupled in parallel to the memory cell. During a read operation, flux bias (ϕ) may be supplied to a memory cell being read using the respective read word-line (RWL). During a read operation, bit-line current (e.g., bias current) may also be supplied to the bit-line being accessed using a flux pump 345 that may be part of bit-line drivers 122 of FIG. 1. As an example, a current-limited voltage source may be used as a flux pump. In this example, the flux pump may be configured to apply a single flux quantum (e.g., $\phi_0$=2.07× 10-15 mA-pH) to an inductive load (e.g., the bit-line) per clock cycle (e.g., per RQL cycle). In this example, if the inductance of each of the bit-lines is 5 pico-Henry (pH), the total inductance of the bit-line will be 1,280 pH. As an example, a memory cell having been triggered into a voltage state due to application of a read-word current and the memory cell being in a 'logic 1' state, the memory cell may remain in a 2.5 mV voltage state until the bit-line current is reduced to zero. In this example, without the LR shunt, the current in the entire bit-line (e.g., the column) must be reduced to zero. However, with the LR shunt, the current in the shunted portion of the bit-line can be reduced to zero while current in the rest of the bit-line remains. Thus, the use of the LR shunt may advantageously result in reduced energy consumption and reduced recovery time. Word-line current may return to zero as soon as the memory cell goes into the voltage state.

After a read operation is completed, the bit-lines (e.g., 124 of FIG. 1) may need to be prepared for the next read operation. If the local bit-line bias current, prior to the read operation, is 70 µA, and the bit-line current after the read operation is zero, that would result in a total flux of 43 $\phi_0$ having been removed from the bit-line. This amount of the flux will need to be replaced in the bit-line before the next read operation. In this example, it will take 43 RQL clock cycles to replace the total flux of 43 $\phi_0$. In addition, the additional inductance associated with the bit-line termination may further increase the number of RQL clock cycles needed to replace the increased amount of flux. In the example of memory cells shown in FIG. 3, the presence of the LR shunt may advantageously improve the performance of the memory because it may help reduce the amount of the flux removed during the read operation. In one example, each of the inductive-shunts (e.g., LR shunt 360, 370, 380, and 390) may be configured to, after the read operation, remove at least a substantial portion of the local bit-line current provided to a respective memory cell during the read operation. The inductance value of the inductor (L) of each of the LR shunts may be selected such that a certain number of flux quanta transferred to inductor (L) may effectively remove the local bit-line current (e.g., the bias current) from read bit-line. In one example, the number of the flux quanta removed may be eight. The removal of the flux quanta from the read bit-line may return a memory cell (e.g., any one of the memory cells 310, 320, 330, and 340) to a "zero-voltage state." The resistance value of resistor (R) of each of the inductive-shunts (e.g., LR shunt 360, 370, 380, and 390) may be selected such that the local bit-line current temporarily routed through the inductive-shunt may be restored to the read bit-line. As an example, if the local bit-line current is 70 ρA, then the inductance of inductor (L) may be selected to be less than 8 $\phi_0$/70 μA=approximately 236 pH. A resistance value of 1Ω, may then restore current to the read bit-line in approximately (L/R=236 pH/1Ω) 236 pico-seconds. Assuming a 10 GHz clock that may translate to approximately 3 RQL clock cycles to restore the current to the read bit-line. The coupling of inductive-shunt to each memory cell may thus advantageously provide a local temporary path to remove the local bias current allowing the memory cell being read to effectively turn-off faster without removing the bias current from the entire read bit-line (e.g., RBL). That, in turn, may advantageously provide a faster recovery time for the read bit-line before the next read operation. In addition, the presence of resistor (R) in the inductive-shunt may redirect the read bit-line current to the memory cell, and that may advantageously prepare the read bit-line for the next read operation. The use of the inductive-shunt (including, for example, inductor L and resistor R) may advantageously make each memory cell more energy-efficient and faster, thereby allowing more frequent read operations. In sum, the inductive-shunt (e.g., each of the LR shunts shown in FIG. 3) may locally and temporarily reduce the memory cell bias to zero, thereby turning off the latching SQUID, within each memory cell, without requiring the removal of the bias current for the entire read bit-line. This may advantageously limit the recovery time of the read bit-line for future reads and may limit the energy dissipated by the memory cell during a read and by the flux pump during restoring the read bit-line bias. In addition, because the effects of the inductive-shunt are local, the memory may be scaled up for any number of memory cells per bit-line. Furthermore, the voltage developed across the latching SQUID may advantageously be small when the SIS-type of Josephson junctions of the memory cell (e.g., 212 and 214 of FIG. 2) are shunted by the resistors, and the voltage may be relatively large when the SIS-type of Josephson junctions are not shunted by the resistors.

In addition, the inductive-shunt may allow the memory cell to latch a signal for a controlled amount of time. This, in turn, may advantageously provide a strong signal to the sense amplifier (e.g., 130 of FIG. 1). Moreover, the response signal of the memory cell may be independent of the activation signal for the word-line read signal. This, in turn, may advantageously relax certain design constraints associated with the timing and the amplitude of the various activation and control signals for a memory system. As an example, there may not be a need for precise control of the amplitude of the read word-line current. Similarly, as an example, there may not be a need for precise control of the duration of the read word-line current.

Although FIG. 3 shows a certain number of components of a portion 300 of the memory system arranged in a certain manner, there could be more or fewer number of components arranged differently.

Figure 4:
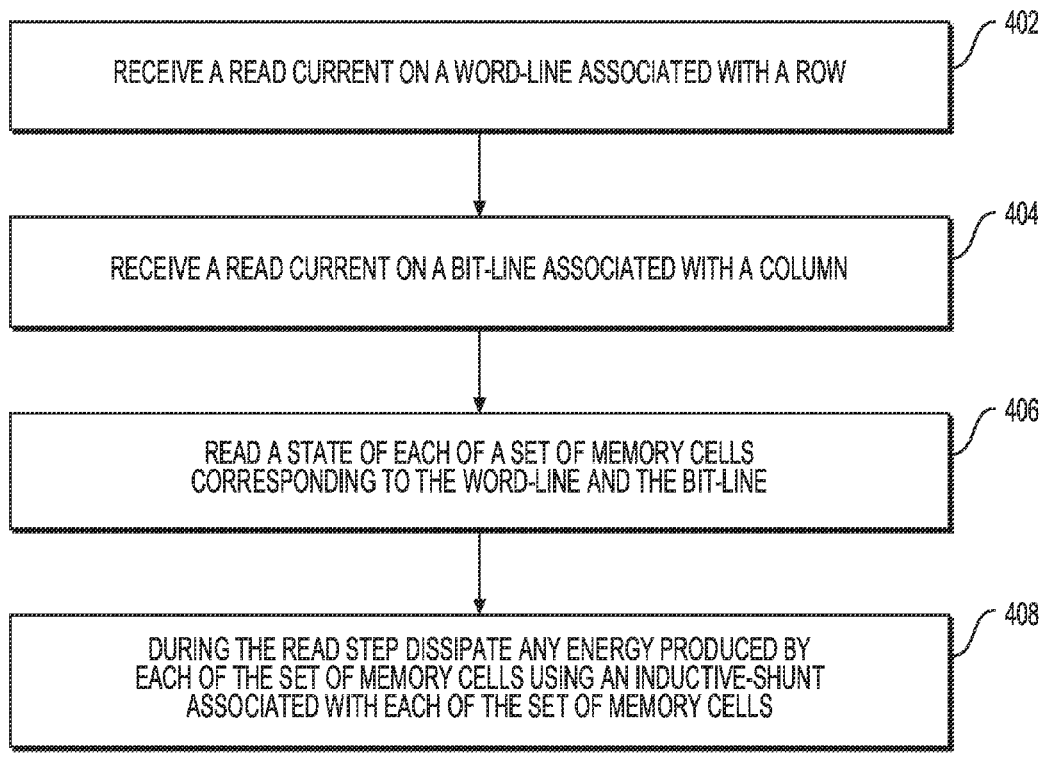
FIG. 4 shows a flow diagram for a method related to a memory system in accordance with one example.

FIG. 4 shows a flow diagram for a method related to memory system 100 in accordance with one example. In step 402, memory system 100 may receive a read current on a read word-line associated with a row or a portion of the row. As an example, based on the address of memory cells being accessed as part of a read operation, at least one read word-line (e.g., one of read word-lines 114 or RWL of FIG. 2) may receive the read current. As discussed earlier, row decoder 110 may decode the row address and activate the appropriate read word-line. A flux pump as part of word-line drivers 112 may provide the read current.

In step 404, memory system 100 may receive a read current on a read bit-line associated with a column. As an example, based on the address of memory cells being accessed as part of a read operation, at least one read bit-line (e.g., one of read bit-lines 124 or RBL of FIG. 2) may receive the read current. As discussed earlier, column decoder 120 may decode the column address and activate the appropriate read bit-line. A flux pump as part of bit-line drivers 122 may provide the read current.

In step 406, as an example, using sense amplifier 130 (FIG. 1), a state of each of a set of memory cells corresponding to the activated read word-line and the activated read bit-line may be read. As discussed earlier, this may include sense amplifier 130 sensing a voltage state of each of a respective memory cell (e.g., memory cell 200). Although this step describes reading the state of a memory cell based on the voltage state, the state of the memory cell may be determined by sensing a change in a resistance or another electrical parameter associated with the memory cell. This step may include performing a read operation in response to a bit-line current applied to at least one bit-line and a word-line current applied to at least one word-line.

Figure 5:
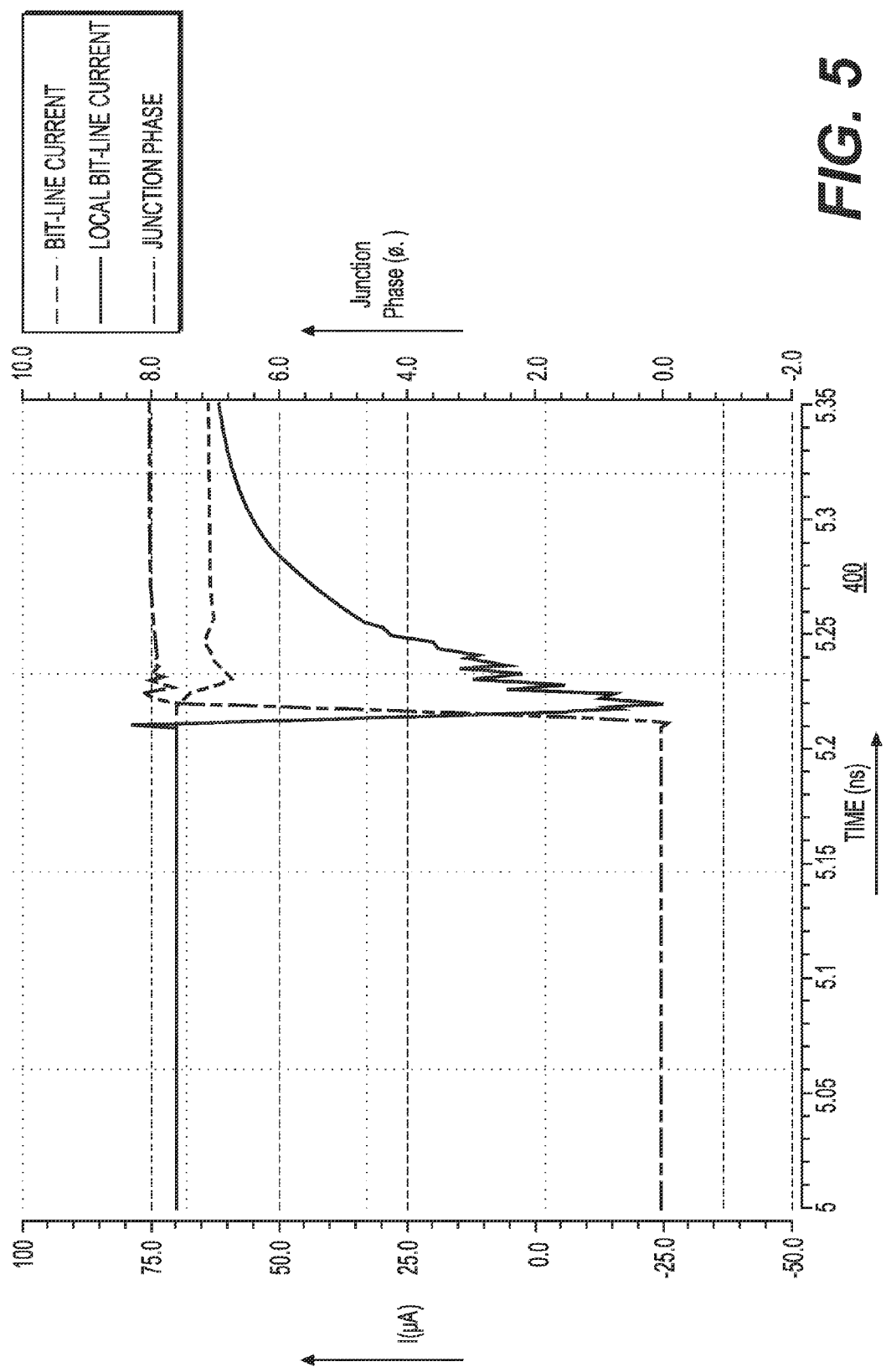
FIG. 5 shows, over time, changes in parameters associated with a memory system.

In step 408, as an example, using an inductive-shunt (e.g., the LR shunts shown in FIG. 3) associated with each of the set of memory cells accessed during the read operation, any energy produced by each of the set of memory cells accessed during the read operation, may be dissipated. For example, using an inductive-shunt, coupled in parallel to a memory cell, at least a substantial portion of the first bit-line current provided to the memory cell, during the read operation, may be removed, without requiring removal of an entirety of the bit-line current applied to the bit-line during the read operation. As explained earlier, this process may include replacing flux quanta removed from the read bit-line. This requires energy that is expended in replacing the flux quanta removed during the read operation to prepare the read bit-line for the next read operation. Consistent with the earlier example, discussed in the context of FIG. 3, if the local bit-line current is 70 μA, then the inductance of the inductor in a LR shunt may be selected to be less than 8 $\phi_0$/70 μA=approximately 236 pH. A resistance value of 1Ω, may then restore current to the read bit-line in approximately (L/R=236 pH/1Ω) 236 pico-seconds. Assuming a 10 GHz RQL clock that may translate to approximately 3 RQL clock cycles to restore the current to the read bit-line. FIG. 5 shows a diagram showing the effect of an inductive-shunt according to one example. As an example, FIG. 5 shows, over time in nano-seconds, changes in the bit-line current, the local bit-line current, and the junction phase (flux quanta) for a memory system (e.g., memory system 100) and a memory cell (e.g., memory cell 200). The horizontal line (from the left to the right) represents the increase in time (TIME (ns)). The left vertical line (from the bottom to the top) represents the changes in current in micro-amperes (μA). The right vertical line (from the top to the bottom) represents the changes in junction phase (in terms of flux quanta). In one example, after the state of the memory cell is read, using an inductive-shunt, junction phase (flux quanta) of approximately 8 $\phi_0$ may be removed from the bit-line. As a result, the local bit-line current (e.g., initially at 70 μA) may drop faster after the read operation because a large amount of the local bit-line current may be re-routed using the inductive-shunt. In addition, as shown in FIG. 5, the local bit-line current may be brought back to almost the previous level faster by restoring the local bit-line current with the help of the resistor of the inductive-shunt. In the example shown in FIG. 5, the memory cell turns off after producing a flux in the amount of 8 $\phi_0$. Because the bit-line current is removed locally, the flux pump is not required to replace the bit-line current through the larger inductance of the complete bit-line. This may advantageously make the recovery time for a read operation associated with this memory cell smaller (e.g., assuming a flux pump restoring one flux quanta per clock, equivalent to 8 RQL clock cycles). In comparison, under similar conditions, an un-shunted memory cell may turn off after producing a flux in the amount of 90 $\phi_0$. In that case, the recovery time for the read operation may be substantially larger. Also, as shown in FIG. 5, the addition of the LR shunt may rapidly reduce the bias current and the bias current may rapidly recover to its steady state value.

Figure 6:
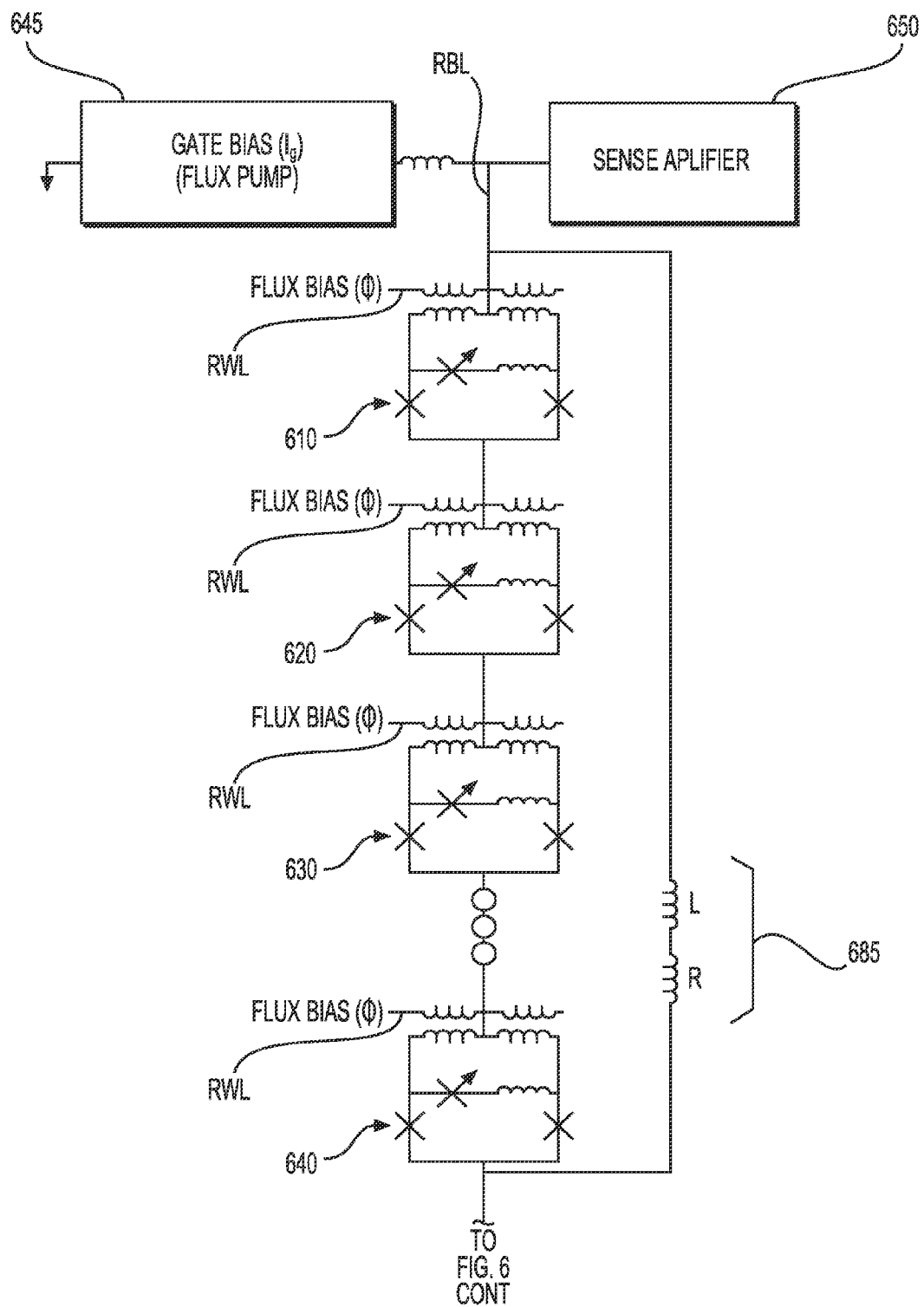
FIG. 6 shows a portion of a memory system with a shared inductive shunt, in accordance with one example.
Figure 6:
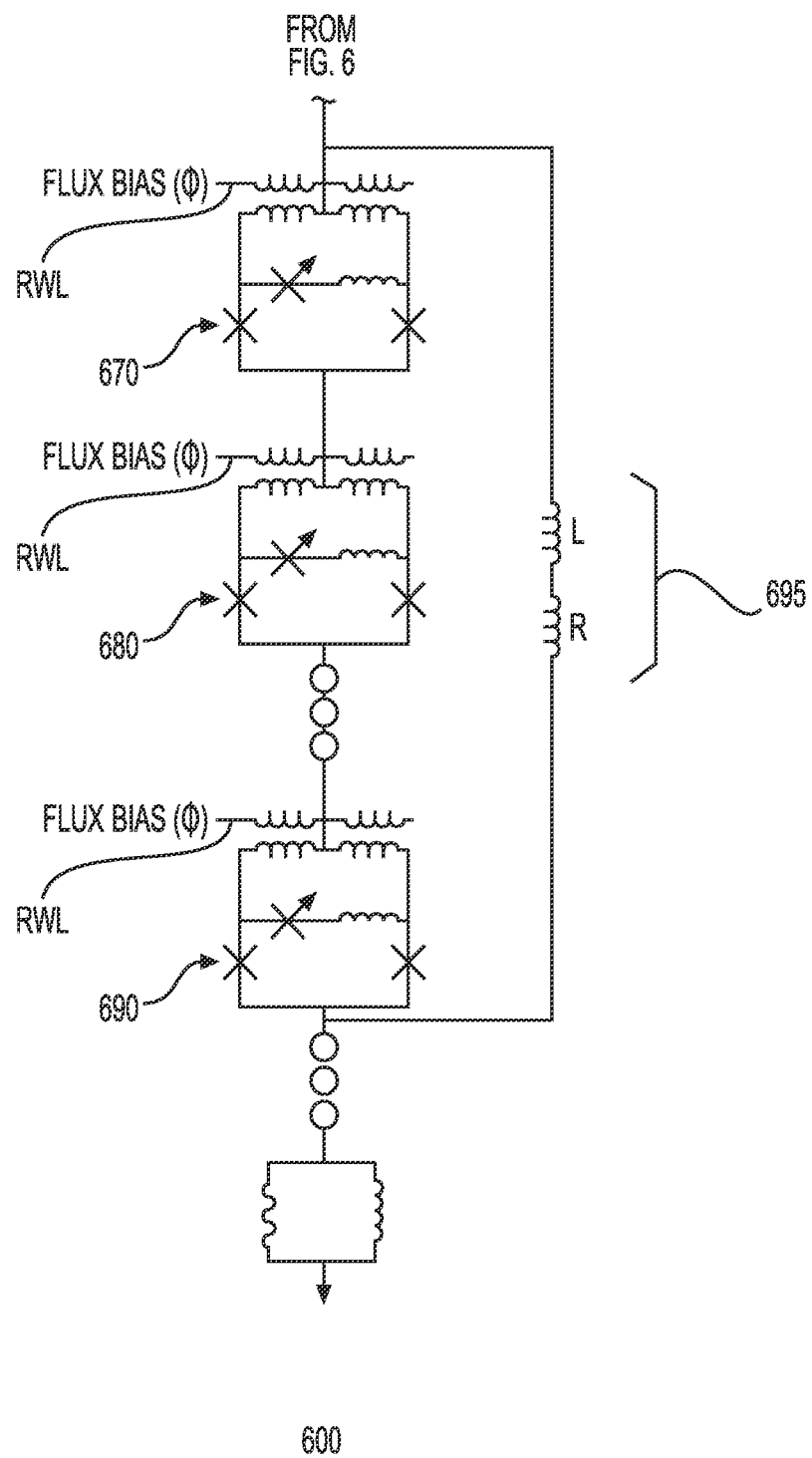

FIG. 6 shows a portion 600 of a memory system with a shared inductive-shunt in accordance with one example. Portion 600 of the memory system may include a column of memory cells (e.g., memory cells 610, 620, 630, 640, 670, 680, and 690) coupled to a read bit-line (RBL). For brevity, the internal components of each of these are shown, but not labeled. They may, however, be similar to the ones shown in FIG. 2 with respect to memory cell 200. A flux pump 645 may be used to supply gate bias to memory cells 610, 620, 630, 640, 670, 680, and 690. A sense amplifier 650 may be used to sense the current on read bit-line to determine a state of a memory cell. During a read operation, flux bias (4)) may be supplied to a memory cell being read using the respective read word-line (RWL). As discussed earlier, an inductive-shunt may be coupled to each memory cell (e.g., FIG. 3). In an alternative example, the memory cells may share an inductive-shunt. As an example, a certain number of memory cells (e.g., memory cells 610, 620, 630, and 640) may share a single LR shunt 685. Similarly, another set of memory cells (e.g., memory cells 670, 680, and 690) may share another LR shunt 695. This may result in a smaller foot-print for memory system 100. As described earlier, as an example, a read word-line (RWL) for performing a read operation may be coupled to each of the memory cells. A write word-line (WWL) (not shown) for performing a write operation may be coupled to each of the memory cells. In addition, a read bit-line (RBL) for performing a read operation may be coupled to each of the memory cells. A write bit-line (WBL) (not shown) for performing a write operation may also be coupled to each of the memory cells. Each of the word-lines may be one of the word-lines 114 of FIG. 1. Similarly, each of the bit-lines may be one of the bit-lines 124 of FIG. 1. At an operational level, each of the memory cells in portion 600 may behave similar to as described with respect to FIG. 2. The inductance value of the shared inductive-shunt, such as inductive-shunts (e.g., LR shunts 685 and 695) may need to be adjusted. As an example, when using a shared inductive-shunt for twelve memory cells, the inductance associated with inductor (L) may be selected such that the inductance of additional memory cells is taken into account. As an example, if the total inductance of the twelve memory cells is 50 pH, then the inductance of inductor (L) may be reduced by 50 pH relative to the previous example of the inductor of FIG. 3. Although FIG. 6 shows a certain number of components of portion 600 of a memory system arranged in a certain manner, there could be more or fewer number of components arranged differently. As an example, although FIG. 6 shows each of the inductors as a single inductor, each could be multiple inductors coupled in parallel to each other. Similarly, although FIG. 6 shows each of the resistors as a single resistor, each could be multiple resistors coupled in parallel to each other.

Figure 7:
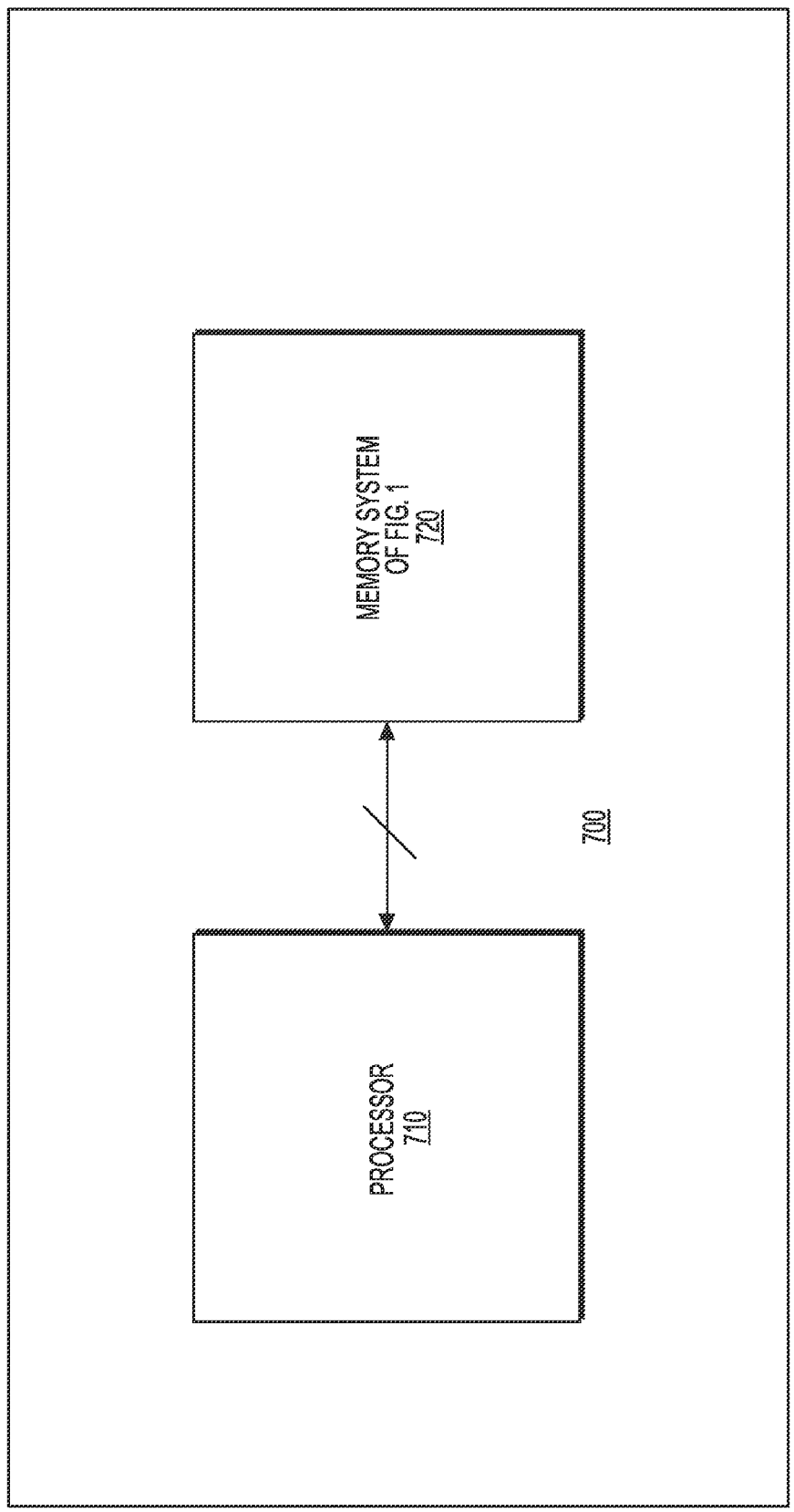
FIG. 7 shows a computing system including a memory, coupled to a processor, in accordance with one example.

FIG. 7 shows a computing system 700 including a processor 710 coupled to a memory 720 (e.g., memory system 100 of FIG. 1) in accordance with one example. Processor 710 may perform read or write operations on memory 720 in a manner as explained earlier. Additionally, processor 710 and memory 720 may be used along with other superconducting logic based devices. In general, any superconducting device operating in cryogenic environments and requiring storage of instructions or data may include memory 720. Furthermore, processor 710 need not be in a cryogenic environment; instead, it may operate at non-cryogenic temperatures. In this example, memory 720 may be in a separate cryogenic environment and may be coupled via connectors to processor 710 in a way that the cryogenic environment can be maintained. Memory 720 may be used as part of storage in a data center for delivering cloud-based services, such as software as a service, platform as a service, or other services.

In conclusion, a memory system including an array of memory cells arranged in rows and columns, is provided. In one example, the memory system includes: (1) a first set of word-lines, where each of the first set of the word-lines is coupled to a first plurality of memory cells in at least one row, and (2) a first set of bit-lines, where each of the first set of the bit-lines is coupled to a second plurality of memory cells in at least one column. Each of the first plurality of the memory cells and each of the second plurality of the memory cells further include at least one memory storage element including at least one Josephson junction, where the at least one Josephson junction is configured to be in either a first state or a second state in response to an application of a word-line current, via at least one of the first set of the word-lines, to the at least one Josephson junction. In this example, a read operation is performed on the at least one memory storage element by an application of a bit-line current to the at least one of the first set of the bit-lines. In this example, each of the first plurality of the memory cells and each of the second plurality of the memory cells further includes at least one inductive-shunt coupled in parallel to the at least one memory storage element, where the inductive-shunt is configured to after the read operation, remove at least a substantial portion of the bit-line current provided to the at least one of the first set of the bit-lines during the read operation. In one example, the at least one Josephson junction comprises at least one magnetic barrier layer. In one example, the first state is a first magnetization state corresponding to a first configuration of magnetization of the at least one magnetic barrier layer and the second state is a second magnetization state corresponding to a second configuration of magnetization of the at least one magnetic barrier layer, where the first configuration of the magnetization is substantially different from the second configuration of the magnetization. In this example, the inductive-shunt may include at least one resistor coupled in series with at least one inductor. The resistor is further configured to, after completion of the read operation, redirect the bit-line current to the at least one of the first set of the bit-lines before a next read operation. In addition, the inductive-shunt may be configured to remove the substantial portion of the bit-line current provided to remove the substantial portion of the bit-line current provided to the at least one memory storage element without de-coupling the at least one of the first set of the bit-lines from the at least one memory storage element. The inductive-shunt may also be configured such that the substantial portion of the bit-line current removed by the inductive-shunt is sufficient to turn-off the at least one memory cell. In one example, the memory system includes components based on reciprocal quantum logic, and where the at least one memory cell further includes an inductor coupled to the at least one Josephson junction to form a superconducting quantum interference device (SQUID).

In another example, a method in a memory system including an array of memory cells arranged in rows and columns, a first set of word-lines, where each of the first set of the word-lines is coupled to a first plurality of memory cells in at least one row, a first set of bit-lines, where each of the first set of the bit-lines is coupled to a second plurality of memory cells in at least one column, where each of the first plurality of the memory cells and each of the second plurality of the memory cells may include at least one memory storage element including at least one Josephson junction comprising a magnetic barrier layer, is provided. In this example, the method includes performing a first read operation in response to a first bit-line current applied to the at least one of the first set of the bit-lines and a first word-line current applied to the at least one of the first set of word-lines. The method further includes using an inductive-shunt, coupled in parallel to the at least one memory storage element, removing at least a substantial portion of the first bit-line current provided to the at least one memory storage element during the first read operation, without requiring removal of an entirety of the first bit-line current applied to the at least one of the first set of the bit-lines during the read operation. In one example, the inductive-shunt includes a resistor coupled in series with an inductor. During the first read operation, the at least one memory storage element may be in a first state or a second state, and where the first state may be a voltage state and the second state may be zero-state. The method further includes removing the at least the substantial portion of the first bit-line current provided to the at least one memory storage element, without de-coupling the at least one memory storage element from the at least one of the first set of bit-lines. The step of removing the at least the substantial portion of the bit-line current provided to the at least one of the first set of bit-lines during the first read operation further includes removing a sufficient current so as to turn-off the at least one memory cell. In one example, the method further includes, after a predetermined number of clock cycles, performing a second read operation by applying a second bit-line current, via the at least one of the first set of the bit-lines, to the at least one Josephson junction. In one example, the memory system includes components based on reciprocal quantum logic, and where the clock cycles correspond to a sinusoidal clock.

In another example, a memory system including an array of memory cells arranged in rows and columns is provided. In this example, the memory system further includes: (1) a first set of word-lines, where each of the first set of the word-lines is coupled to a first plurality of memory cells in at least one row, and (2) a first set of bit-lines, where each of the first set of the bit-lines is coupled to a second plurality of memory cells in at least one column. Each of the first plurality of the memory cells and each of the second plurality of the memory cells further includes at least one memory storage element including at least one Josephson junction comprising at least one magnetic barrier layer, where the at least one magnetic barrier layer may be configured to be in either a first magnetization state or a second magnetization state in response to an application of a word-line current, via at least one of the first set of the word-lines, to the at least one Josephson junction. A read operation is performed on the at least one memory storage element by an application of a bit-line current to at least one of the first set of the bit-lines. The memory system further includes at least one means for removing at least a substantial portion of bit-line current provided to at least one of the first set of the bit-lines during the read operation. In one example, the means for removing at least the substantial portion of bit-line current is an inductive-shunt coupled in parallel to at least N memory storage elements, wherein N is a positive integer, and where the inductive-shunt is configured to after the read operation, remove at least a substantial portion of the bit-line current provided to the at least N memory storage elements without requiring removal of an entirety of the bit-line current applied to the at least one of the first set of the bit-lines during the read operation. In another example, the at least one means for removing at least the substantial portion of bit-line current is an inductive-shunt coupled in parallel to each of the array of the memory cells. In one example, the first magnetization state corresponds to a first configuration of magnetization of the at least one magnetic barrier layer and the second magnetization state corresponds to a second configuration of magnetization of the at least one magnetic barrier layer, where the first configuration of the magnetization is substantially different from the second configuration of the magnetization. In this example, the means for removing at least the substantial portion of the bit-line current may be an inductive-shunt, including at least one resistor coupled in series with at least one inductor. The resistor is further configured to, after completion of the read operation, redirect the bit-line current to the at least one of the first set of the bit-lines before a next read operation. In addition, the means for removing at least the substantial portion of the bit-line current may include means for removing the substantial portion of the bit-line current provided to the at least the N memory storage elements without de-coupling the at least one of the first set of the bit-lines from each of the at least the N memory storage elements. The means for removing at least the substantial portion of the bit-line current may also be configured such that the portion of the bit-line current removed by the inductive-shunt is sufficient to turn-off the at least one memory cell.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 710, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A memory system comprising:
an array of memory cells arranged in rows and columns;
a first set of word-lines, wherein each of the first set of the word-lines is coupled to a first plurality of memory cells in at least one row;
a first set of bit-lines, wherein each of the first set of the bit-lines is coupled to a second plurality of memory cells in at least one column;
wherein each of the first plurality of the memory cells and each of the second plurality of the memory cells comprises:
at least one memory storage element comprising at least one Josephson junction configured to be in either a first state or a second state in response to an application of a word-line current, via the at least one of the first set of the word-lines, to the at least one Josephson junction, and wherein a read operation on the at least one memory storage element is performed in response to an application of a bit-line current to the at least one of the first set of the bit-lines; and
at least one inductive-shunt coupled in parallel to the at least one memory storage element, wherein the inductive-shunt is configured to after the read operation, remove at least a substantial portion of the bit-line current provided to the at least one memory storage element without requiring removal of an entirety of the bit-line current applied to the at least one of the first set of the bit-lines during the read operation.

2. The memory system of claim 1, wherein the at least one inductive-shunt comprises at least one resistor coupled in series with at least one inductor.

3. The memory system of claim 2, wherein, the resistor in the at least one inductive-shunt is configured to, after completion of the read operation, redirect the bit-line current to the at least one of the first set of the bit-lines before a next read operation.

4. The memory system of claim 1, wherein the at least one inductive-shunt is configured to remove the substantial portion of the bit-line current provided to the at least one memory storage element without de-coupling the at least one of the first set of the bit-lines from the at least one memory storage element.

5. The memory system of claim 1, wherein the at least one inductive-shunt is further configured such that the substantial portion of the bit-line current removed by the inductive-shunt is sufficient to turn-off the at least one memory cell.

6. The memory system of claim 1, wherein the memory system comprises components based on reciprocal quantum logic, and wherein the at least one memory cell further comprises an inductor coupled to the at least one Josephson junction to form a superconducting quantum interference device (SQUID).

7. The memory system of claim 1, wherein the at least one Josephson junction comprises at least one magnetic barrier layer, and wherein the first state comprises a first magnetization state corresponding to a first configuration of magnetization of the at least one magnetic barrier layer and the second state comprises a second magnetization state corresponding to a second configuration of magnetization of the at least one magnetic barrier layer, wherein the first configuration of the magnetization is substantially different from the second configuration of the magnetization.

8. A method in a memory system comprising an array of memory cells arranged in rows and columns, a first set of word-lines, wherein each of the first set of word-lines is coupled to a first plurality of memory cells in at least one row, a first set of bit-lines, wherein each of the first set of the bit-lines is coupled to a second plurality of memory cells in at least one column, wherein each of the first plurality of the memory cells and each of the plurality of the second plurality of the memory cells comprises at least one memory storage element comprising at least one Josephson junction, the method comprising:

performing a first read operation in response to a first bit-line current applied to at least one of the first set of the bit-lines and a first word-line current applied to at least one of the first set of word-lines; and using an inductive-shunt, coupled in parallel to the at least one memory storage element, removing at least a substantial portion of the first bit-line current provided to the at least one memory storage element during the first read operation, without requiring removal of an entirety of the first bit-line current applied to the at least one of the first set of the bit-lines during the first read operation.

9. The method of claim 8, wherein the inductive-shunt comprises at least one resistor coupled in series with at least one inductor.

10. The method of claim 8, wherein during the first read operation, the at least one memory storage element is in a first state or a second state, and wherein the first state is a voltage state and the second state is a zero-state.

11. The method of claim 8 further comprising removing the at least the substantial portion of the first bit-line current provided to the at least one memory storage element, without de-coupling the at least one memory storage element from the at least one of the first set of bit-lines.

12. The method of claim 8, wherein the removing the at least the substantial portion of the first bit-line current provided to the at least one memory storage element further comprises removing a sufficient current so as to turn-off the at least one memory cell.

13. The method of claim 12 further comprising, after a predetermined number of clock cycles, performing a second read operation in response to a second bit-line current applied to the at least one of the first set of the bit-lines.

14. The method of claim 13, wherein the memory system comprises components based on reciprocal quantum logic, and wherein the clock cycles correspond to a sinusoidal clock.

15. A memory system comprising:
an array of memory cells arranged in rows and columns;
a first set of word-lines, wherein each of the first set of word-lines is coupled to a first plurality of memory cells in at least one row;
a first set of bit-lines, wherein each of the first set of bit-lines is coupled to a second plurality of memory cells in at least one column;
wherein each of the first plurality of the memory cells and each of the second plurality of the memory cells comprises:
at least one memory storage element comprising at least one Josephson junction comprising at least one magnetic barrier layer, wherein the at least one magnetic barrier layer is configured to be in either a first magnetization state or a second magnetization state in response to an application of a word-line current, via at least one of the first set of the word-lines, to the at least one Josephson junction, wherein a read operation on the at least one memory storage element is performed by an application of a bit-line current to the at least one of the first set of the bit-lines; and
at least one inductive-shunt coupled in parallel to at least N memory storage elements, wherein N is a positive integer, and wherein the inductive-shunt is configured to after the read operation, remove at least a substantial portion of the bit-line current provided to the at least the N memory storage elements without requiring removal of an entirety of the bit-line current applied to the at least one of the first set of the bit-lines during the read operation.

16. The memory system of claim 15, wherein the at least one inductive-shunt comprises a resistor coupled in series with an inductor.

17. The memory system of claim 15, wherein the at least one inductive-shunt is configured to remove the substantial portion of the bit-line current provided to the at least the N memory storage elements without de-coupling the at least one of the first set of the bit-lines from each of the at least the N memory storage elements.

18. The memory system of claim 15, wherein, the resistor in the at least one inductive-shunt is configured to, after completion of the read operation, redirect a substantial portion of the bit-line current to the at least one of the first set of the bit-lines before a next read operation.

19. The memory system of claim 15, wherein the at least one inductive-shunt is further configured such that the substantial portion of the bit-line current removed by the inductive-shunt is sufficient to turn-off each of the second plurality of the memory cells comprising the at least the N memory storage elements.

20. The memory system of claim 15, wherein the first magnetization state corresponds to a first configuration of magnetization of the at least one magnetic barrier layer and the second magnetization state corresponds to a second configuration of magnetization of the at least one magnetic barrier layer, wherein the first configuration of the magnetization is substantially different from the second configuration of the magnetization.

* * * * *